US006917226B2

(12) United States Patent
Brown

(10) Patent No.: US 6,917,226 B2
(45) Date of Patent: Jul. 12, 2005

(54) TRANSFORMER COUPLING ARRANGEMENT AND METHOD USING A PLURALITY OF DRIVERS

(75) Inventor: David Alan Brown, Carp (CA)

(73) Assignee: Potentia Semiconductor, Inc., Wilmington, DE (US)

( * ) Notice: Subject to any disclaimer, the term of this patent is extended or adjusted under 35 U.S.C. 154(b) by 0 days.

(21) Appl. No.: 10/428,104

(22) Filed: May 2, 2003

(65) Prior Publication Data

US 2004/0217782 A1 Nov. 4, 2004

(51) Int. Cl.[7] .............................. H03B 1/10; H03K 3/00
(52) U.S. Cl. ...................................................... 327/110
(58) Field of Search ................................. 327/108, 110

(56) References Cited

U.S. PATENT DOCUMENTS

| 4,648,019 | A | * | 3/1987 | Stahl | 363/43 |
| 4,758,836 | A | | 7/1988 | Sciulli | 340/870.31 |
| 5,949,659 | A | | 9/1999 | Lesche | 363/16 |
| 6,008,681 | A | * | 12/1999 | Beutler et al. | 327/304 |
| 6,087,870 | A | | 7/2000 | Sakamoto | 327/176 |
| 6,603,805 | B1 | * | 8/2003 | Hisano et al. | 375/219 |
| 6,674,382 | B1 | * | 1/2004 | Jordan | 341/144 |

FOREIGN PATENT DOCUMENTS

| EP | 0 456 419 A2 | 2/1991 | ......... H03K/19/003 |

* cited by examiner

Primary Examiner—Quan Tra

(57) ABSTRACT

A signal is coupled from the primary to the secondary of a transformer, to a signal receiver which has a supply voltage derived from the signal via a rectifier arrangement including a filter capacitor. A plurality of signal drivers on the primary side have their outputs enabled by output enable signals with different timing for different ones of the drivers. The different timing includes small delays to spread crowbar currents over a short period, enabling an increasing number of drivers with increasing initial charge of the capacitor, and disabling drivers while others remain enabled, in order to reduce peak currents and kick-back voltages.

19 Claims, 4 Drawing Sheets of drivers, and is par-
TRANSFORMER COUPLING ARRANGEMENT AND METHOD USING A PLURALITY OF DRIVERS This invention relates to a transformer coupling arrangement and method using a plurality of drivers, and is particularly concerned with such an arrangement for use in a power supply controller.

Reference is directed to the following copending United States patent applications filed simultaneously herewith, the entire disclosure of each of which is hereby incorporated herein by reference:

"Power Supply Controller", R. Orr et al., Ser. No. 10/428,095;

"Sequencing Power Supplies", D. Brown et al., Ser. No. 10/428,105;

"Signal And Power Transformer Coupling Arrangements", R. Orr et al., Ser. No. 10/428,103;

"Coupling Signals Via A Coupling Arrangement", D. Brown et al., Ser. No. 10/428,102.

BACKGROUND

The related applications describe and claim a power supply controller, and various features thereof, which can be used for controlling a plurality of isolating power supplies, such as switch mode power supplies or DC power converters, for providing controlled electrical power to loads. For example, the power supplies may provide different supply voltages to various electrical circuits on a circuit card on which the power supply controller is also provided.

In such a power supply controller, separate IC (integrated circuit) control units can be provided on the primary and secondary sides of a transformer that serves to maintain an electrical isolation barrier between input and output sides of the isolating power supplies. The transformer conveniently provides for signal coupling in both directions between the primary and secondary control units, and also for power transfer from its primary to its secondary side to supply operating power to the secondary control unit and any related circuits (for example, a non-volatile memory) of the power supply controller on the secondary side of the transformer.

In order to provide sufficient power transfer to the secondary side, the control unit on the primary side must be capable of providing substantial current drive to the primary of the transformer. To provide such a high current drive, while also complying with other requirements such as for signal levels, IC characteristics and limitations, and bidirectional signal transmission, a plurality of drivers may be used in parallel on the primary side of the transformer. For example, the control unit on the primary side may include of the order of ten such drivers to provide a drive current up to the order of 100 mA.

The present inventor has recognized that such use of a plurality of drivers in parallel can lead to a number of disadvantages, and that these disadvantages can be avoided or reduced by techniques of the present invention.

Conversely, similar disadvantages that may apply to other arrangements for transferring power via a transformer using only one driver, or using two or more drivers, on the primary side of the transformer can be avoided or reduced by using a plurality of drivers using techniques of the present invention. Accordingly, although the invention is described in detail in the context of a power supply controller, it can be appreciated that the invention is not limited to this particular application.

SUMMARY OF THE INVENTION

According to one aspect of this invention there is provided a transformer coupling arrangement comprising: a transformer having primary and secondary windings; a plurality of drivers each having a signal input, an output coupled to the primary winding of the transformer, and an output enable (OE) input, each driver being responsive to a respective OE signal supplied to its OE input to couple a transmit signal, supplied to the inputs of the plurality of drivers, to the output of the respective driver and hence to the primary winding of the transformer; and a rectifier arrangement coupled to the secondary winding for producing a dc output in response to the transmit signal coupled to the primary winding of the transformer from the drivers, the rectifier arrangement including a filter capacitor coupled to the dc output; the arrangement being such that timing of the OE signals supplied to the OE inputs is different for different ones of the plurality of drivers.

Different aspects of the timing of the OE signals can be arranged to achieve a variety of desirable results, and in particular to achieve reduced peak currents, reduced kick-back voltages, and reduced crowbar currents. These aspects can be used individually, but are preferably used in combination.

Preferably the arrangement is such that different ones of the OE signals are delayed by different small (relative to other timing such as the signal bit duration) delays so that different ones of the plurality of drivers are enabled at different time instants over a short (again relative to other timing such as the signal bit duration) period. To this end, the arrangement can include a delay line for producing a plurality of clock signals delayed relative to one another by different small delays, and a plurality of circuits for producing the OE signals at different time instants in dependence upon respective ones of the clock signals. The transmit signal supplied to the inputs of the plurality of drivers is preferably delayed by at least a maximum of said small delays.

In addition, preferably the OE signals supplied to the drivers are such that for initial charging of the capacitor a number of said plurality of drivers enabled by respective OE signals is increased with increasing charge of the capacitor. Preferably also the OE signals supplied to the drivers are such that at least one of the drivers is disabled by its respective OE signal while at least one other of the drivers remains enabled by its respective OE signal. This reduces kick-back voltages as the capacitor is charged.

The arrangement preferably includes a signal receiver coupled to the secondary winding of the transformer for receiving said transmit signal, and preferably said capacitor provides a supply voltage for the signal receiver.

The invention also provides a method of coupling a signal via a transformer, comprising the steps of: supplying the signal to a signal input of each of a plurality of drivers having outputs coupled to a primary winding of the transformer; and enabling outputs of the drivers with respective output enable (OE) signals having a timing that is different for different ones of the plurality of drivers.

The step of enabling outputs of the drivers can comprise delaying different ones of the OE signals by different small delays so that different ones of the plurality of drivers are enabled at different time instants over a short period, and can further comprise the step of delaying the signal supplied to a signal input of each of the plurality of drivers by at least a maximum of said small delays.

The method preferably further comprises the steps of: rectifying and filtering a signal produced by a secondary winding of the transformer to produce a dc output; and receiving the signal produced by the secondary winding of the transformer in a receiver having a supply voltage derived from said dc output. The step of filtering can use a filter capacitor and the step of enabling outputs of the drivers can comprise initially charging the capacitor by enabling an increasing number of said drivers with increasing charge of the capacitor. The method can further comprise the step of increasing a duty cycle of at least one OE signal with increasing charge of the capacitor.

The step of enabling outputs of the drivers with respective OE signals preferably comprises disabling at least one of the drivers while at least one other of the drivers remains enabled. For a binary signal, it is desirable for this disabling to take place during each transition of the signal.

BRIEF DESCRIPTION OF THE DRAWINGS

The invention will be further understood from the following description by way of example with reference to the accompanying drawings, in which.

DETAILED DESCRIPTION

Figure 1:
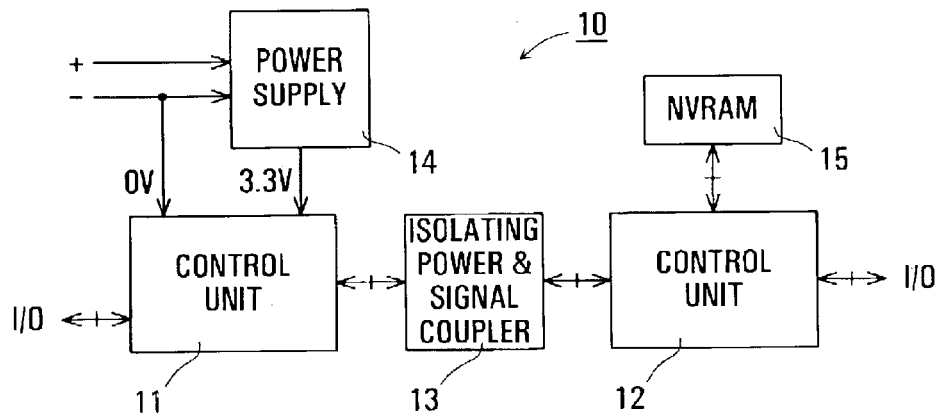
FIG. 1 shows a block diagram of a power supply controller to which embodiments of the invention may be applied.

Referring to FIG. 1, a power supply controller 10 is illustrated for controlling a plurality of isolating power supplies (not shown) to which the power supply controller is connected via I/O (input and/or output) ports of two control units 11 and 12. By way of example, the power supply controller 10 and the isolating power supplies that it controls may all be provided on a circuit card (not shown), which also includes electrical circuits (not shown) constituting loads to be powered by the power supplies. In use, the circuit card is inserted in an equipment slot and thereby connected to a backplane (not shown) which provides connections to a power source, for example a nominally 48 volt source via connections + and − in FIG. 1.

Via the I/O ports of the control units 11 and 12, the power supply controller 10 can for example monitor the source voltage, monitor and adjust the output voltages of the controlled power supplies, and control sequencing of the power supplies via enable inputs of the power supplies. These functions generally require connections of the power supply controller 10 to both the primary and secondary sides of the isolating power supplies which it controls. In order to maintain electrical isolation between the primary and secondary sides, connections to the primary side are made from the control unit 11, connections to the secondary side are made from the control unit 12, and the two control units communicate with one another via a bidirectional isolating signal coupler 13 between them, the coupler 13 also forming a part of the power supply controller 10.

For simplicity and convenience, and for consistency with the terminology used for the isolating power supplies, the control units 11 and 12 are also referred to as first and second units respectively, or as primary and secondary control units respectively; the respective sides of the coupler 13 are also referred to as primary and secondary sides. In addition, drawing references below use suffixes -P and -S to denote similar components on respectively the primary and secondary sides of the power supply controller 10.

As illustrated in FIG. 1, the power supply controller 10 also comprises a power supply 14 and a non-volatile random access memory (NVRAM) 15. The source voltage is supplied to the power supply 14, which provides a supply voltage to the control unit 11. The power supply 14 can for example be a current mode flyback power supply to provide sufficient power for the power supply controller 10, with a start-up circuit provided by a depletion mode MOSFET, and for example provides a supply voltage of 3.3 volts to the control unit 11.

The coupler 13 not only provides for bidirectional signal coupling between the control units 11 and 12, but also couples power in an isolated manner from the control unit 11 to the control unit 12, this coupled power serving to supply operating power to the secondary side of the power supply controller 10, including the control unit 12 and the NVRAM 15. The NVRAM 15 serves to store information used in operation of the power supply controller 10, this information being transferred to shadow registers in the control units 11 and 12 on power-up of the power supply controller 10.

All of the components 11 to 15 of the power supply controller 10 are desirably integrated into a single package, in which each of the control units 11 and 12 conveniently comprises an application-specific IC (ASIC).

Figure 2:
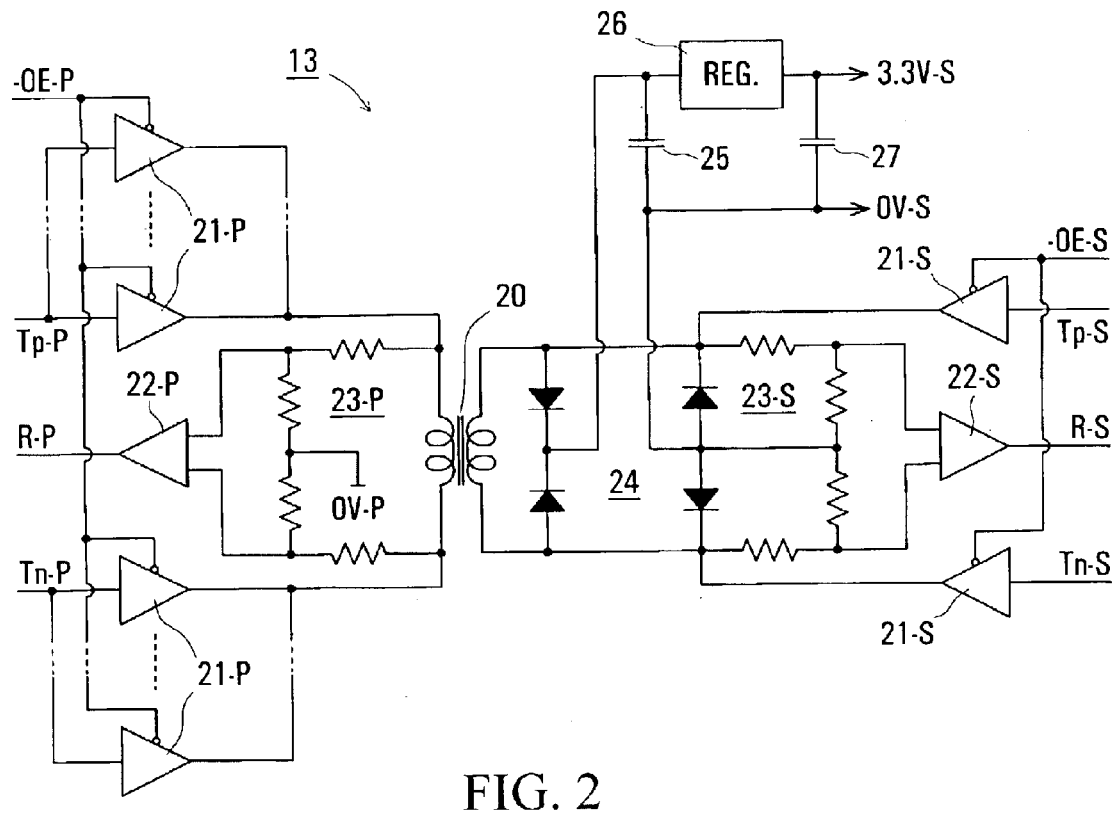
FIG. 2 schematically illustrates an isolating signal and power coupler of the power supply controller of FIG. 1.

Referring to FIG. 2, one form of the isolating signal and power coupler 13 comprises a transformer 20 with primary and secondary windings which are coupled to transmit-receive units of the control units 11 and 12 respectively.

On the primary side, the transmit-receive unit of the control unit 11 comprises differential signal transmit buffers 21-P, a differential signal receiver 22-P, and a balanced resistive potential divider 23-P. To provide a sufficient current drive to the transformer to power the secondary side of the power supply controller as described further below, a plurality of (for example, of the order of 10, only two being shown for simplicity) transmit buffers 21-P are connected in parallel with one another, to couple differential signals Tp-P and Tn-P supplied to their inputs via their outputs, when an active-low output enable (OE) signal -OE-P is low, to the primary winding of the transformer 20.

When the OE signal -OE-P is high, the outputs of the transmit buffers 21-P have a high impedance, and a signal received from the secondary side of the transformer 20 can be coupled via the resistive potential divider 23-P to the inputs of the differential signal receiver 22-P, which produces at its output a receive signal R-P for the control unit 11.

Similarly, on the secondary side, the transmit-receive unit of the control unit 12 comprises differential signal transmit buffers 21-S, a differential signal receiver 22-S, and a balanced resistive potential divider 23-S. The transmit buffers 21-S, which are not replicated because they are not required for power transfer, couple differential signals Tp-S and Tn-S supplied to their inputs via their outputs, when an active-low output enable (OE) signal -OE-S is low, to the secondary winding of the transformer 20. When the OE signal -OE-S is high, the outputs of the transmit buffers 21-S have a high impedance, and a signal received from the primary side of the transformer 20 can be coupled via the resistive potential divider 23-S to the inputs of the differential signal receiver 22-S, which produces at its output a receive signal R-S for the control unit 11.

The secondary side of the coupler 13 also includes a diode bridge 24 connected to the secondary winding of the transformer 20, a filter capacitor 25, a low drop out (LDO) voltage regulator 26, and a further capacitor 27, for producing a supply voltage for the control unit 12 and NVRAM 15.

By way of example, with the primary side supply voltage of 3.3 volts as described above, the transformer 20 can have a primary to secondary turns ratio of 3:5, and the regulator 26 can provide a secondary side supply voltage 3.3V-S also of 3.3 volts. Zero voltages 0V-P and 0V-S on the primary and secondary sides of the transformer 20 are also illustrated in FIG. 2, these being isolated from one another to maintain the electrical isolation between the primary and secondary.

The resistive potential dividers 23-P and 23-S can be designed to provide large differential signals (greater than 1.5 volts) at the inputs of the receivers 22, while limiting input voltage swings to a range of 0 to 3.3 volts. For example, all of the resistors of the potential divider 23-P can have the same resistance R, for example 5.7 kΩ; the two resistors of the potential divider 23-S connected to the transformer secondary winding can each have a resistance 4.5R, and the other two resistors of the potential divider 23-S can each have a resistance R.

Conveniently, Manchester code is used for the signals, to avoid transformer saturation and to facilitate simple clock recovery. Signals are coupled between the control units 11 and 12 in opposite directions in an alternating or ping-pong manner with a timing determined by the control unit 11. For signal coupling from the primary control unit 11 to the secondary control unit 12, the differential signal Tp-P, Tn-P is supplied from the control unit 11 to produce the signal R-S for the control unit 12, the outputs of the transmit buffers 21-P being enabled and the outputs of the transmit buffers 21-S being disabled at this time. This signal also provides for power transfer from the transmit buffers 21-P via the transformer 20 and the components 24 to 27 to produce the supply voltage for the control unit 12 and NVRAM 15. For signal coupling in the opposite direction from the secondary control unit 12 to the primary control unit 11, the differential signal Tp-S, Tn-S is supplied from the control unit 12 to produce the signal R-P for the control unit 11, the outputs of the transmit buffers 21-S being enabled and the outputs of the transmit buffers 21-P being disabled at this time.

On power-up, when the capacitors 25 and 27 are initially discharged, the OE signal -OE-P can be used to increase a duty cycle of the signal Tp-P, Tn-P progressively from a small value, to reduce peak current flow for charging these capacitors.

As indicated above, the present inventor has recognized certain disadvantages of the form of the coupler 13 as described above with reference to FIG. 2. In particular, these disadvantages include the following:

During a start-up process in which the capacitor 25 is charged from its initial fully discharged state, even with a progressively increasing duty cycle as indicated above, large peak currents (for example, of the order of 800 mA) can occur. Such large peak currents can contribute to noise on the primary side supply voltage line, to which the control units can be relatively sensitive because they include analog as well as digital circuitry, and potential reset of the primary control unit 11.

Also, during the start-up process, large kick-back voltages (for example, of the order of 8 volts or more) can occur on turn-off of the drivers 21-P. Such large kick-back voltages can exceed voltage ratings for the ICs, potentially damaging electrostatic discharge protection and causing a latch-up condition.

During steady-state operation, similarly large peak currents can occur on turn-on of the plurality of transmit buffers or drivers 21-P. In addition, with light loading of the LDO regulator 26 on the secondary side, the capacitor 25 can be overcharged to an undesirably high voltage.

Also, during steady-state operation, a large current spike (for example, of the order of 200 mA or more) can occur due to crowbar current on turn-on of the transmit buffers or drivers 21-P. The crowbar (also referred to as shoot-through or cross conduction) current refers to current flow through both of the complementary MOS output transistors of each driver as it is switched.

These disadvantages are avoided or reduced by techniques in accordance with this invention and described in detail below. In particular, these techniques involve modifying the timing of switching (i.e. turn-on and/or turn-off) of different ones or groups of the plurality of transmit buffers or drivers 26-P in a manner that substantially reduces the peak currents and/or kick-back voltages, thereby reducing the consequent disadvantages.

The invention is further described below in the context of an isolating signal and power coupler 13 similar to that described above with reference to FIG. 2, modified as described further below, in an arrangement using Manchester encoded data with each encoded data bit having a duration equal to six periods of a clock frequency of 33.86 MHz, i.e. a duration of 177.2 ns. In steady-state operation, the data bits are coupled in both directions via the transformer 20 in a ping-pong manner as indicated above, each ping-pong period including 24 data bits which are coupled from the primary to the secondary, and 24 data bits which are subsequently coupled from the secondary to the primary. Each ping-pong period can also include other components such as guard and fill times to accommodate timing differences between the control units 11 and 12, and for example each cycle has a duration, determined by the control unit 11, of 60 bits or 10.63 $\mu$s. The start-up process includes 64 periods of 10.63 $\mu$s, during which an idle or dummy signal, and hence power, is coupled in only one direction from the primary control unit 11 to the secondary control unit 12. All of these details are given only by way of example of one particular embodiment of the invention.

Figure 3:
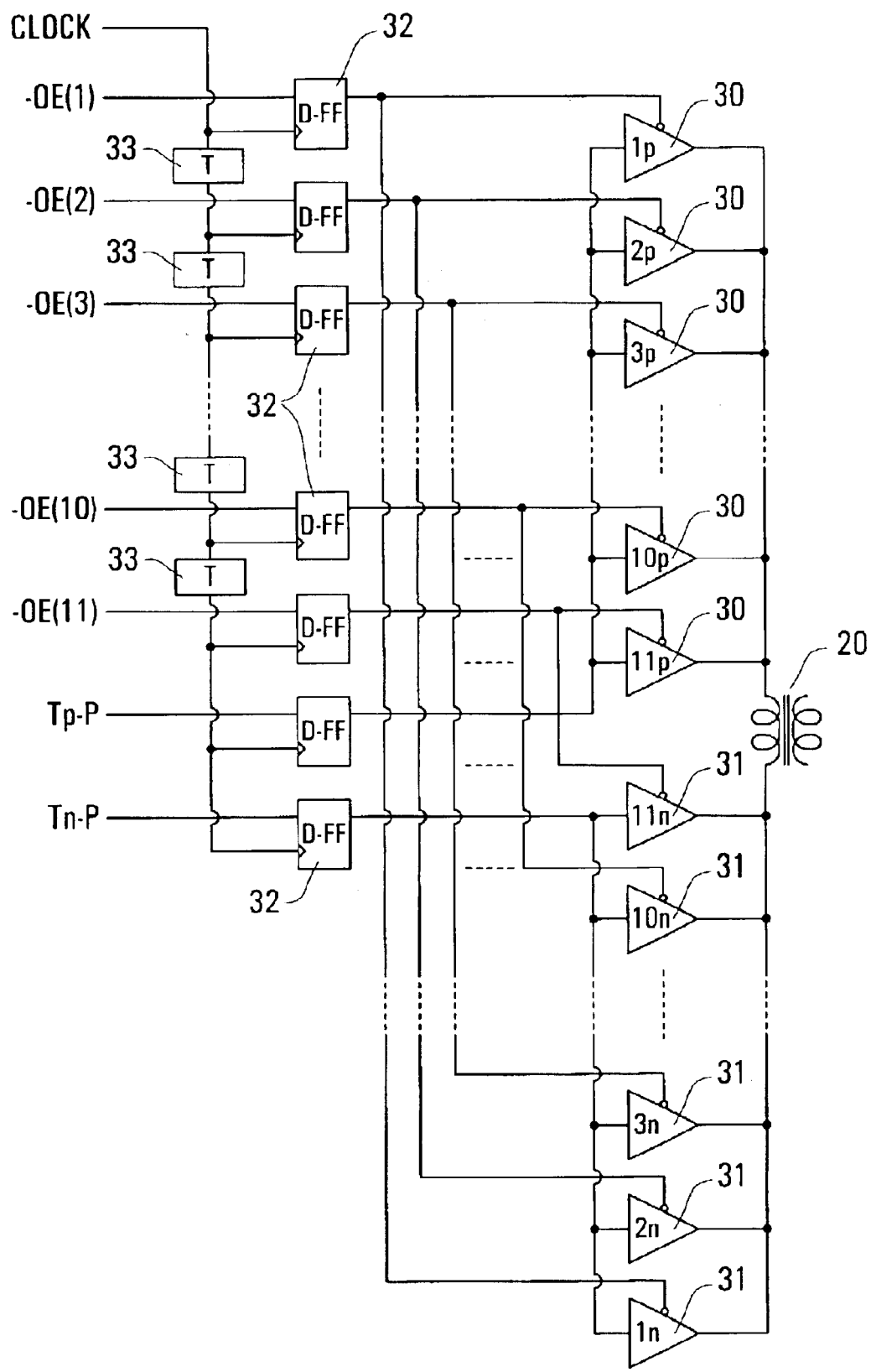
FIG. 3 schematically illustrates a modified form of parts of the coupler of FIG. 2 in accordance with an embodiment of the invention.

In this embodiment of the invention, the isolating signal and power coupler 13 comprises 11 pairs of transmit buffers or drivers corresponding to the drivers 21-P in FIG. 2. FIG. 3 illustrates these drivers, their output connections to the primary winding of the transformer 20, and related modifications to the form of the coupler 13 shown in FIG. 2. The differential signal receiver on the primary side of the coupler 13, and the secondary side of the coupler, are not show in FIG. 3, and can be arranged in a similar manner to that shown in FIG. 2.

Referring to FIG. 3, each pair of transmit buffers or drivers comprises a respective positive driver 30 and negative driver 31 whose outputs are connected to respective ends of the primary winding of the transformer 20, in a similar manner to that of the drivers 21-P of FIG. 2. The positive drivers 30 are individually identified as drivers 1p to 11p, and the negative drivers 31 are individually identified as 1n to 11n, the numbers 1 to 11 referring to the respective pairs of drivers. For clarity, FIG. 3 shows only some of the pairs of drivers and associated circuitry described below; the others are indicated by dashed lines.

The arrangement of FIG. 3 differs from that of FIG. 2 in that active low output enable (OE) signals -OE(1) to -OE(11) can be provided individually for each pair of drivers 30 and 31. In addition, these OE signals are retimed by coupling them through respective D-type flip-flops (D-FF) 32, whose clock inputs are individually phased by ten cascaded delay elements 33 provided in series in a clock signal line supplied by a clock signal CLOCK.

Thus for example the OE signal -OE(1) is supplied via a D-FF 32 clocked by the signal CLOCK to the OE inputs of the first pair of drivers 1p, 1n; the OE signal -OE(2) is supplied via a D-FF 32 clocked by the signal CLOCK, delayed by one delay element 33, to the OE inputs of the second pair of drivers 2p, 2n; the OE signal -OE(3) is supplied via a D-FF 32 clocked by the signal CLOCK, delayed by two delay elements 33, to the OE inputs of the third pair of drivers 3p, 3n; and so on, with the OE signal -OE(11) being supplied via a D-FF 32 clocked by the signal CLOCK, delayed by ten delay elements 33, to the OE inputs of the last pair of drivers 11p, 11n.

This last delayed clock signal also serves to clock two further D-FFs 32, via which the differential components Tp-P and Tn-P of the signal to be coupled to the secondary side are supplied to the signal inputs of all of the positive drivers 30 and all of the negative drivers 31, respectively.

Each of the delay elements provides a short time delay T, so that the clock signal supplied to the successive D-FFs 32, and hence enabling of the outputs of successive pairs of the drivers (for which the respective OE signal is active low) is progressively delayed. Consequently, crowbar currents of the drivers 30 and 31, which have a short duration as the drivers switch, do not all occur simultaneously as would otherwise be the case, but are spread over a period determined by the total time delay 10T of the delay elements 33.

By way of example, each delay element 33 can be constituted by one or more logic elements such as AND gates whose propagation delay constitutes the time delay T. In a particular embodiment of the invention, each delay element 33 is constituted by two such gates, or their equivalent such as two inverters, connected in cascade. While each such delay element provides only a very short time delay T, for example of the order of 1 ns or less, this can be sufficient to reduce substantially the peak current due to the crowbar currents of the drivers, for example from the order of 200 mA to the order of 50 mA.

In the waveform diagrams of FIGS. 5 to 7 as described below, the phasing or retiming of the OE signals for the drivers 30 and 31 as described above with reference to FIG. 3 is not shown because of the relatively short period over which it occurs. Although a particular arrangement for implementing this retiming is described above, and this provides such retiming to both the turn-on or enabling and the turn-off or disabling of the drivers, it can be appreciated that a similar retiming of the OE of different ones or groups of the drivers can be provided in other ways.

As indicated above, on power-up of the power supply controller 10, the capacitor 25 on the secondary side of the transformer 20 must be charged from its initial fully discharged state, by power transfer via the transformer 20. As also indicated above, peak current flow for charging this capacitor during a start-up process can be reduced by progressively increasing a duty cycle using the OE signals of the transmit buffers or drivers on the primary side of the transformer 20. However, controlling a plurality of drivers in parallel as described above with reference to FIG. 2 can still result in excessive peak current during start-up.

This excessive peak current arises in part because, as illustrated in FIG. 2, there is no inductor in the power supply path between the diode bridge rectifier 24 and the capacitor 25, as would typically be provided in a power supply arrangement and would serve to limit peak current. Providing such an inductor is undesirable in the power supply controller 10 because of its small size and integrated form.

In order to substantially reduce this peak current, during a start-up process the OE signals supplied to the drivers 30 and 31 in the coupler arrangement of FIG. 3 are controlled individually and in groups. In one embodiment of the invention, this control is carried out in a manner as further described below, but it can be appreciated that other combinations of the drivers can alternatively be used to similar ends.

In this embodiment, the pairs of drivers 30 and 31 are arranged in three groups: a first group consists of only the driver pair 11p, 11n controlled by the OE signal -OE(11); a second group, referred to as group A, consists of the five driver pairs 1p, 1n to 5p, 5n controlled by the OE signals -OE(1) to -OE(5), represented as -OE(1:5); and a third group, referred to as group B, consists of the five driver pairs 6p, 6n to 10p, 10n controlled by the OE signals -OE(6:10).

As indicated above, the start-up process includes 64 periods of 10.63 µs, for a total duration of about 680 µs, which is divided equally into 8 consecutive frames each comprising 480 bit durations. During all of these frames the coupling is one-way, from the primary to the secondary of the transformer 20, to provide power to the secondary side to charge the capacitor 25 to provide a supply voltage for the control unit 12 so that it can commence operation. The signal supplied to the drivers 30 and 31 during these frames is a dummy or idle signal, for example comprising alternating 1 and 0 bits.

During these start-up frames the drivers 30 and 31 are controlled by the OE signals as shown by the following table:

| Frame | Driver 11 −OE(11) | Group A −OE(1:5) | Group B −OE(6:10) |
| --- | --- | --- | --- |
| 1 | 1 bit in every 6 | no bits | no bits |
| 2 | 1 bit in every 4 | no bits | no bits |
| 3 | 1 bit in every 3 | no bits | no bits |
| 4 | 1 bit in every 2 | no bits | no bits |
| 5 | all bits | no bits | no bits |
| 6 | all bits | 1 bit in every 2 | no bits |
| 7 | all bits | all bits | no bits |
| 8 | all bits | all bits | all bits |

Thus in the first five frames of the start-up process, only one driver pair has its output enabled, and the duty cycle is progressively increased from 1 in every 6 bit periods (16.67% duty) to all 480 bits in each frame (100% duty). In contrast to the arrangement of FIG. 2, during these frames the other driver pairs do not have their outputs enabled at all. Consequently, peak current on initial charging of the capacitor 25 is substantially reduced, being limited to the saturation current available from the single driver pair 11p, 11n.

During frames 6 and 7 of the start-up process the group A drivers also have their outputs enabled, with 50% duty in frame 6 and 100% duty in frame 7, and in frame 8 the group B drivers also have their outputs enabled. Although in these last three frames the current available from the drivers is rapidly increased for charging the capacitor 25, by this point in the start-up process the capacitor has been significantly charged, so that the current does not become excessive.

Figure 4:
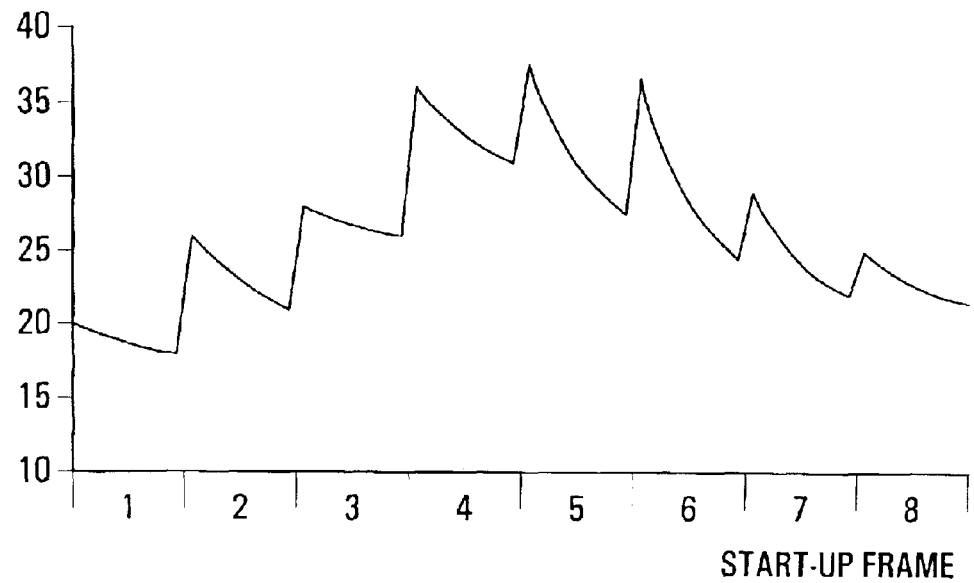
FIG. 4 is a graph illustrating current flow during a start-up process of the power supply coupler using the modified form of coupler.

FIG. 4 is a graph illustrating current flow during a start-up process as described above, assuming a load of 1 kΩ on the secondary side (a current of about 5 mA as the voltage across the capacitor 25 approaches 5 volts). As can be seen from this graph, the peak current remains below about 40 mA throughout the start-up process, this being far less than a peak current of the order of 800 mA which could occur if all of the driver pairs were simultaneously enabled as in the arrangement of FIG. 2.

As also indicated above, during the start-up process large kick-back voltages can occur on turn-off of the drivers 21-P in the coupler 13 of FIG. 2. This situation arises because, in the driver arrangement of FIG. 2, when the drivers 21-P are turned off or disabled their outputs are rapidly switched to a high impedance state. At the turn-off time current has been flowing in the primary winding of the transformer; this current through the transformer inductance can not instantaneously change, and in attempting to maintain this current the transformer produces a relatively high kick-back voltage at the outputs of the drivers 21-P which can exceed the voltage ratings of the drivers.

This problem occurs during the start-up process, due to voltage differences between the capacitor 25, as reflected through the transformer 20 to the primary side, and the primary side supply voltage as filtered by an output capacitance of the power supply 14. The magnitude of the kick-back voltage depends upon the number of drivers that are turned-off at the same time. In order to reduce the magnitude of the kick-back voltage, this embodiment of the invention modifies the turn-off times of the transmit drivers 21-P, during the start-up process, in a manner illustrated in FIG. 5.

Figure 5:
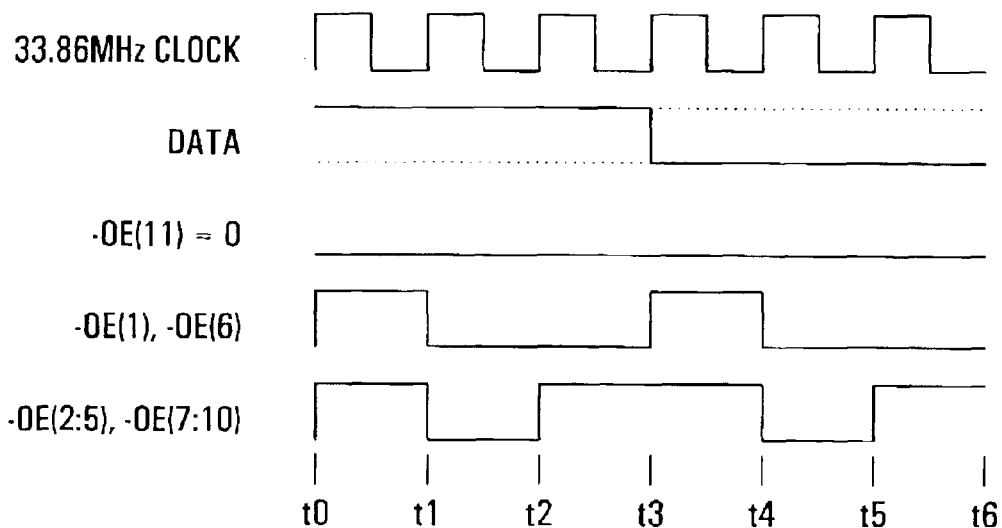
FIGS. 5 to 7 are waveform diagrams illustrating signals which occur in operation of the power supply controller using the modified form of coupler.

FIG. 5 shows the 33.86 MHz clock, with times t0 to t6 corresponding to the clock periods, and output enable signals for the transmit drivers for one Manchester encoded bit duration. The data can be a binary 1 represented by a high level from t0 to t3 and a low level from t3 to t6 as shown by a solid data line, or a binary 0 represented by a low level from t0 to t3 and a high level from t3 to t6 as shown by a broken data line, in each case with a transition at the centre of the bit duration at the time t3. The output enable signals are shown in FIG. 5 for a bit for which all of the drivers 21-P are enabled in accordance with the start-up frames as described above.

As shown by the signal -OE(11)=0 in FIG. 5, the driver pair 11p, 11n is enabled (active low) for the entire duration t0 to t6 of the respective bit. As shown by the signal -OE(1), -OE(6) in FIG. 5, for each group A or B of drivers one driver pair 1p, 1n or 6p, 6n is enabled for the last two-thirds of each half bit duration, i.e. for the periods t1 to t3 and t4 to t6. Further, as shown by the signal -OE(2:5), -OE(7:10) in FIG. 5, for each group A or B of drivers the four remaining driver pairs are enabled for only the centre one-third of each half bit duration, i.e. for the periods t1 to t2 and t4 to t5.

Consequently, at each of the times t2 and t5 four of the five drivers 21-P in each group are turned off, but the driver 1 in group A, the driver 6 in group B, and the driver 11 remain on or enabled and provide a relatively low impedance at their outputs, thereby considerably reducing any kick-back voltage due to the turn-off of the other eight drivers. Also, at each of the times t3 and t6 the driver 1 in group A and the driver 6 in group B are turned off, but the driver 11 remains enabled to provide a relatively low impedance at its output, thereby reducing the kick-back voltage due to the turn-off of the two drivers 1 and 6.

Thus in this manner the parallel output impedances of 3 drivers are used to reduce the kick-back voltage of 8 drivers being turned off, and subsequently the output impedance of one driver is used to reduce the kick-back voltage of 2 drivers being turned off. While this subdivision of the drivers has been determined to provide an effective reduction of the kick-back voltage, it can be appreciated that other subdivisions of the drivers, and/or other times at which drivers are turned off, can be used to suit particular circumstances.

Figure 6:
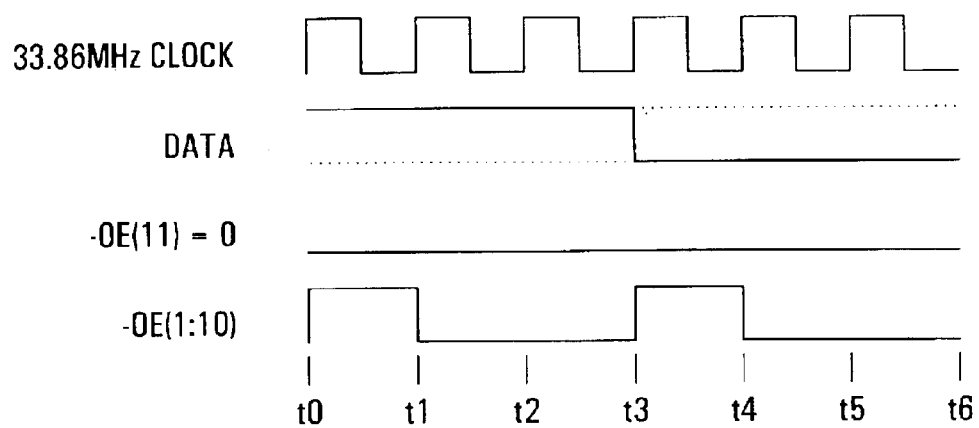

During steady-state operation, the transmit buffers or drivers are enabled in a different manner, as illustrated in FIG. 6. In a similar manner to FIG. 5, FIG. 6 shows the 33.86 MHz clock, times t0 to t6, and output enable signals for the transmit drivers for one Manchester encoded bit duration. As shown by the signal -OE(11)=0 in FIG. 6, again the driver pair 11p, 11n is enabled (active low) for the entire duration t0 to t6 of the respective bit. As shown by the signal -OE(1:10) in FIG. 6, each of the other ten driver pairs is enabled for the last two-thirds of each half bit duration, i.e. for the periods t1 to t3 and t4 to t6.

Bearing in mind that, as described above with reference to FIG. 3, the differential signal Tp-P, Tn-P is supplied to the drivers 21-P delayed by the D-FFs 32 by the same delay as the signal -OE(11), this being slightly greater than the delay in the D-FFs 32 for the other output enable signals, it can be appreciated from FIG. 6 that, at the transition at the centre of the data bit at the time t3, only the pair 11p, 11n of the drivers 21-P is enabled, the other driver pairs having just been disabled. Similarly, at data transitions that occur between consecutive similar bits (both 1 or both 0) of the Manchester encoded data, at the times t0 and t6, only the pair 11p, 11n of the drivers 21-P is enabled, the other driver pairs again having just been disabled.

Consequently, at the instant of each transition of the encoded data, only the driver pair 11p, 11n is enabled. This has the effect of critically damping the reactive load seen by the drivers 21-P, thereby reducing oscillations, and in particular prevents the capacitor 25 from being charged to an undesirably high voltage under light secondary loads. Furthermore, this limits the peak current that can flow, on each transition of the encoded data, to the saturation current of only the driver pair 11p, 11n, thereby considerably reducing the peak current that can occur in steady-state operation.

Figure 7:
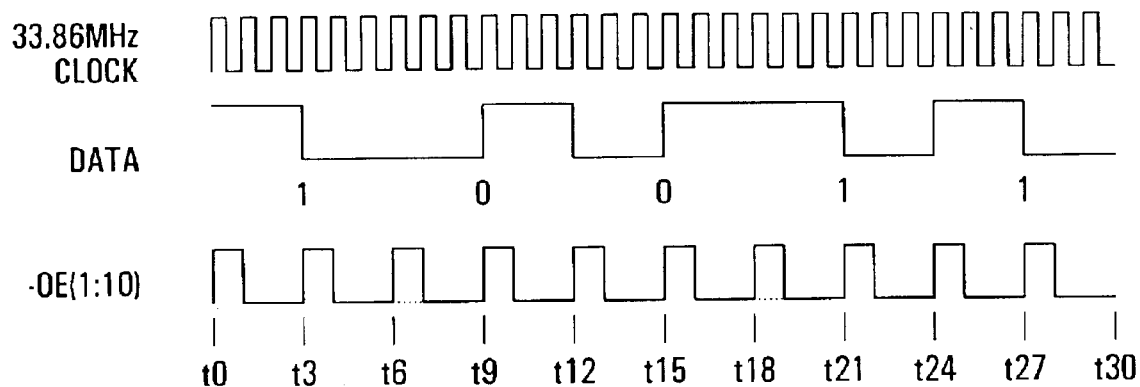

FIG. 7 correspondingly illustrates the 33.86 MHz clock and the output enable signal -OE(1:10) (the output enable signal -OE(11)=0 as in FIG. 6) for a Manchester encoded sequence of data bits 10011, also showing times t0, t3, t6, . . . , t30 at some of which data transitions occur. As shown by a solid line waveform in FIG. 7, the output enable signal -OE(1:10) is active low for the last two-thirds of each half bit duration, as described above with reference to FIG. 6.

However, it can be appreciated that for consecutive data bits which are not the same, for example at the time t6 when the data changes from a 1 bit to a 0 bit and at the time t18 when the data changes from a 0 bit to a 1 bit, there is no transition of the Manchester encoded data. Consequently, there is no need for the outputs of the drivers 1 to 10 to be disabled at these times, and the output enable signal -OE (1:10) can instead remain active low at these times until the next encoded data transition, as shown by broken lines in FIG. 7. This may be preferred for optimizing power transfer from the primary to the secondary side of the transformer 20.

In contrast to the transmit buffers or drivers 21-P of the primary control unit 11, the drivers 21-S of the secondary control unit 12 in this embodiment of the invention are not required to transfer power as well as a signal, and conveniently can each be constituted by a single relatively low-current driver. This has the advantages of minimizing crowbar losses in the driver, as well as losses due to charging and discharging circuit capacitances with either primary or secondary side driving, and the relatively higher output impedance of such secondary side drivers can critically damp the reactive load seen by the drivers 21-S, thereby reducing oscillations. However, a start-up process with progressively increasing duty cycle, similar to that described above for the primary side, can also conveniently be used for the secondary side drivers 21-S.

It can be appreciated that although all of the techniques described above can be used in combination, it is also possible for any of these to be used individually. In addition, it will be appreciated that numerous details and parameters are described above to provide a clear and full description of embodiments of the invention, and that these may be changed for other embodiments of the invention.

For example, although the above description and the drawings relate to a differential signal arrangement, this need not be the case and other arrangements can be provided. For example, either or both of the control units 11 and 12 can instead use an unbalanced arrangement in which one end of the respective transformer winding is connected to the respective ground or 0V connection, and the other end is coupled to a transmit buffer output and a receiver input which can be positive or negative with respect to 0V. In addition, it can be appreciated that the diode bridge 24 can be replaced by another form of rectifier arrangement, such as a full-wave, half-wave, or voltage multiplying rectifier arrangement.

Furthermore, although the invention is described above in the context of a power supply controller, it can be appreciated that the invention is not limited to this particular application.

Thus although particular embodiments of the invention are described above in detail, it can be appreciated that numerous modifications, variations, and adaptations may be made without departing from the scope of the invention as defined in the claims.

What is claimed is:

1. A transformer coupling arrangement comprising:
   a transformer having primary and secondary windings;
   a plurality of drivers each having a signal input, an output coupled to the primary winding of the transformer, and an output enable (OE) input, each driver being responsive to a respective OE signal supplied to its OE input to couple a transmit signal, supplied to the inputs of the plurality of drivers, to the output of the respective driver and hence to the primary winding of the transformer; and
   a rectifier arrangement coupled to the secondary winding for producing a dc output in response to the transmit signal coupled to the primary winding of the transformer from the drivers, the rectifier arrangement including a filter capacitor coupled to the dc output;
   the arrangement being such that timing of the OE signals supplied to the OE inputs is different for different ones of the plurality of drivers and such that different ones of the OE signals are delayed by different small delays so that different ones of the plurality of drivers are enabled at different time instants over a short period.

2. A transformer coupling arrangement comprising:
   a transformer having primary and secondary windings;
   a plurality of drivers each having a signal input, an output coupled to the primary winding of the transformer, and an output enable (OE) input, each driver being responsive to a respective OE signal supplied to its OE input to couple a transmit signal, supplied to the inputs of the plurality of drivers, to the output of the respective driver and hence to the primary winding of the transformer; and
   a rectifier arrangement coupled to the secondary winding for producing a dc output in response to the transmit signal coupled to the primary winding of the transformer from the drivers, the rectifier arrangement including a filter capacitor coupled to the dc output;
   the arrangement being such that timing of the OE signals supplied to the OE inputs is different for different ones of the plurality of drivers;
   the arrangement including a delay line for producing a plurality of clock signals delayed relative to one another by different small delays, and a plurality of circuits for producing the OE signals at different time instants in dependence upon respective ones of the clock signals.

3. A transformer coupling arrangement as claimed in claim 2 wherein the transmit signal supplied to the inputs of the plurality of drivers is delayed by at least a maximum of said small delays.

4. A transformer coupling arrangement comprising:
   a transformer having primary and secondary windings;
   a plurality of drivers each having a signal input, an output coupled to the primary winding of the transformer, and an output enable (OE) input, each driver being responsive to a respective OE signal supplied to its OE input to couple a transmit signal, supplied to the inputs of the plurality of drivers, to the output of the respective driver and hence to the primary winding of the transformer; and
   a rectifier arrangement coupled to the secondary winding for producing a dc output in response to the transmit signal coupled to the primary winding of the transformers from the drivers, the rectifier arrangement including a filter capacitor coupled to the dc output;
   the arrangement being such that timing of the OE signals supplied to the OE inputs is different for different ones of the plurality of drivers;
   the arrangement including a signal receiver coupled to the secondary winding of the transformer for receiving said transmit signal, wherein said capacitor provides a supply voltage for the signal receiver.

5. A transformer coupling arrangement as claimed in claim 4 wherein the OE signals supplied to the drivers are such that for initial charging of the capacitor a number of said plurality of drivers enabled by respective OE signals is increased with increasing charge of the capacitor.

6. A transformer coupling arrangement as claimed in claim 5 wherein the OE signals supplied to the drivers are such that at least one of the drivers is disabled by its respective OE signal while at least one other of the drivers remains enabled by its respective OE signal.

7. A transformer coupling arrangement as claimed in claim 4 wherein each of the plurality of drivers comprises a pair of differential signal drivers.

8. A method of coupling a signal via a transformer, comprising the steps of:
   supplying the signal to a signal input of each of a plurality of drivers having outputs coupled to a primary winding of the transformer; and
   enabling outputs of the drivers with respective output enable (OE) signals having a timing that is different for different ones of the plurality of drivers;

wherein the step of enabling outputs of the drivers comprises delaying different ones of the OE signals by different small delays so that different ones of the plurality of drivers are enabled at different time instants over a short period.

9. A method as claimed in claim 8 and comprising the step of delaying the signal supplied to a signal input of each of the plurality of drivers by at least a maximum of said small delays.

10. A method as claimed in claim 9 and further comprising the steps of:

rectifying and filtering a signal produced by a secondary winding of the transformer to produce a dc output; and receiving the signal produced by the secondary winding of the transformer in a receiver having a supply voltage derived from said dc output.

11. A method as claimed in claim 10 wherein the step of filtering uses a filter capacitor and the step of enabling outputs of the drivers comprises initially charging the capacitor by enabling an increasing number of said drivers with increasing charge of the capacitor.

12. A method as claimed in claim 11 and further comprising the step of increasing a duty cycle of at least one OE signal with increasing charge of the capacitor.

13. A method as claimed in claim 11 wherein the step of enabling outputs of the drivers with respective OE signals comprises disabling at least one of the drivers while at least one other of the drivers remains enabled.

14. A method as claimed in claim 13 and comprising the step of delaying the signal supplied to a signal input of each of the plurality of drivers by at least a maximum of said small delays.

15. A method as claimed in claim 8 and further comprising the steps of:

rectifying and filtering a signal produced by a secondary winding of the transformer to produce a dc output; and receiving the signal produced by the secondary winding of the transformer in a receiver having a supply voltage derived from said dc output.

16. A method as claimed in claim 15 wherein the step of filtering uses a filter capacitor and the step of enabling outputs of the drivers comprises initially charging the capacitor by enabling an increasing number of said drivers with increasing charge of the capacitor.

17. A method as claimed in claim 16 and further comprising the step of increasing a duty cycle of at least one OE signal with increasing charge of the capacitor.

18. A method as claimed in claim 11 wherein the signal is a binary signal and the stop of enabling outputs of the drivers with respective OE signals comprises disabling at least one of the drivers, during each transition of said signal, while at least one other of the drivers remains enabled.

19. A method as claimed in claim 11 wherein each of the plurality of drivers comprises a pair of differential signal drivers and the step of supplying the signal comprises supplying the signal differentially via the drivers to the primary winding of the transformer.

* * * * *

UNITED STATES PATENT AND TRADEMARK OFFICE
CERTIFICATE OF CORRECTION

PATENT NO.       : 6,917,226 B2                                      Page 1 of 1
APPLICATION NO. : 10/428104
DATED            : July 12, 2005
INVENTOR(S)      : David A. Brown It is certified that error appears in the above-identified patent and that said Letters Patent is hereby corrected as shown below:

Column 11, claim 1, line 57, change "...de..." to --...dc...--

Column 12, claim 2, line 11, change "...de..." to --...dc...--

Column 14, claim 18, line 19, change "...stop..." to --...step...--

Signed and Sealed this

Twenty-second Day of August, 2006

JON W. DUDAS
*Director of the United States Patent and Trademark Office*